United States Patent [19]

Yun

[11] 3,995,216

[45] Nov. 30, 1976

[54] TECHNIQUE FOR MEASURING SURFACE STATES IN METAL-INSULATOR-SEMICONDUCTOR STRUCTURES

[75] Inventor: Bob Hong Yun, South Burlington, Vt.

[73] Assignee: International Business Machines Corporation, Armonk, N.Y.

[22] Filed: Apr. 28, 1975

[21] Appl. No.: 572,237

[52] U.S. Cl. .................... 324/158 R; 324/158 D; 324/60 R
[51] Int. Cl.² .................. G01R 31/26; G01R 27/26
[58] Field of Search ........ 324/158 D, 158 R, 158 T, 324/60 R

[56] References Cited
OTHER PUBLICATIONS
Frohman-Bentchkowsky et al., "Charge Transport...", J. of Applied Physics, July 1969, pp. 3307–3319.

*Primary Examiner*—Palmer C. Demeo
*Assistant Examiner*—Ernest F. Karlsen
*Attorney, Agent, or Firm*—Francis J. Thornton

[57] ABSTRACT

An apparatus for measuring and quantitatively determining the number of surface states at or near the insulator-semiconductor interface in a metal-insulator-semiconductor (MIS) structure by injecting a controlled amount of charge into the insulator to induce a change in the surface state occupancy and measuring simultaneously and directly the amount of charge injected into the insulator, the charge so induced in the semiconductor and in the surface states and the corresponding change in the surface potential of the semiconductor induced by the injected charge.

12 Claims, 10 Drawing Figures

TECHNIQUE FOR MEASURING SURFACE STATES IN METAL-INSULATOR-SEMICONDUCTOR STRUCTURES

BACKGROUND OF THE INVENTION

1. Field of the Invention

This invention relates generally to an apparatus and a method for measuring the surface state charges in a metal-insulator-semiconductor structure by measuring simultaneously and directly the amount of charge injected into the insulator, the net change in the semiconductor body and its surface and the change in the surface potential of the semiconductor body.

2. Description of the Prior Art

Surface state density has been evaluated by using capacitance measurement schemes and conduction measurement techniques. To measure surface states close to the bottom of the conduction band or top of the valence band, the so-called Gray-Brown shift technique is sometimes also used.

In each of the known capacitance measurement techniques difficulties arise because the surface state capacitance must be extracted from the measured capacitance which consists of the insulator capacitance, the depletion capacitance and the surface state capacitance.

The conductance method yields more accurate and reliable results than the capacitance method, but is extremely tedious to use in practice. More importantly, because of the length of time required for this measurement, this method is particularly susceptible to errors caused by the change in charge in the insulator during the measurement.

In the Journal of Applied Physics, Vol. 40, No. 8, July 1969, there is discussed the charge transport and storage of charge carriers in metal-nitride-oxidesemiconductor (MNOS) structures. This paper discusses a physical model for nonvolatile semiconductor, memory devices such as the MNOS type device which is based on the assumption that charge accumulation occurs solely at the interface of the oxide and the nitride.

C. A. T. Salamar and G. W. Taylor in the Journal of Physics Scientific Instruments, 1970, Vol. 3, on pages 558–560 discusses a system for the automatic measurement of the moment of charge storage in MNOS memory structures. The apparatus described does provide some charge storage measurements only if the assumption discussed above is valid. The apparatus utilizes a feedback loop for the purpose of speeding up these measurements.

U.S. Pat. No. 2,790,141, issued Apr. 23, 1957, to D. V. Geppert entitled "Semiconductor Measuring System" teaches that the life time of minority carriers in a semiconductor device can be measured by impinging a modulated light beam on a semiconductor sample and transforming a portion of the modulated beam into an electrical signal so that the phase of the electrical signal can be compared with the resulting output signal of the semiconductor device.

U.S. Pat. No. 2,863,119, issued Dec. 2, 1958, to L. Davis, Jr. entitled "Transistor Testing Systems" teaches that the base width of a junction type transistor can be measured by injecting current carriers into the device and permitting them to diffuse across the base region of the device so that the diffusion time may be measured and the width of the base region determined.

U.S. Pat. No. 3,287,637, issued Nov. 22, 1966, to W. Keller entitled "High Frequency Current Means Including Capacitive Probe Members for Determining the Electrical Resistance of a Semiconductor Layer", teaches a device for determining the resistance of thin semiconductor layers by applying a high frequency current supply across two electrodes and measuring the current between the electrodes through the thin semiconductor layer so that the resulting voltage across the layer can be measured as indicative of the resistance of the layer.

U.S. Pat. No. 3,290,179, issued Dec. 6, 1966, to F. S. Goulding entitled "Method and Apparatus for Determining Drift Depth of Impurities in Semiconductors" teaches that the thickness of a region of a semiconductor material can be mesured so that the optimum time of terminating a drifting process in the manufacture of a device can be obtained. It is crucial to realize that the prior arts and the related teachings mentioned are valid for the measurement of surface states if and only if the flat band voltage of the MIS structure does not change during the measurements necessary for determining the density of surface states. The change in the flat band voltage of the MIS structure frequently arises from the change in the charge distribution in the insulator. At times, the density of surface states itself may, too, change during the measurement sequence. Should that occur, it will also lead to a change in the flat band voltage of the MIS structure.

No teaching is made, by any of the above authors to suggest that surface state measurements could be made by any other method nor did they teach any method which would measure the surface state charges in a metal-insulator-semiconductor structure by injecting a controlled amount of charges into the insulator to induce a change in the charge state in the semiconductor and in the surface state, whereby the amount of charge so injected into the insulator from a charge injection source and the corresponding change in the surface potential of the semiconductor body can be simultaneously and directly measured, free of any errors caused by the change in the flat band voltage of the MIS structure.

SUMMARY OF THE INVENTION

Broadly speaking the present invention teaches a technique and an apparatus for reliably and unambiguously measuring the surface states in a metal-insulator-semiconductor structure.

The apparatus can be utilized for measuring all the surface states in the entire energy band gap of a semiconductor.

The apparatus can also be used to great advantage to measure the effect on the surface states caused by changes in the process used to produce the metal-insulator-semiconductor structure under study, rapidly, simply, and unambiguously.

The apparatus is particularly designed to measure fast surface states in a MIS structure, where fast surface states are those states that exchange charge readily with the conduction band or valence band of the semiconductor body.

The apparatus provides an extremely rapid and simple measurement of the change in surface state charge corresponding to a change in surface potential of the semiconductor, without the need of time-consuming capacitance voltage measurements or conductance measurements which require extensive interpretation and calculation.

The apparatus thus overcomes the drawback of prior measuring techniques and avoids the requirement that the charge distribution in the insulator remain constant during the measurement sequence.

The present invention is best realized through an apparatus for applying a DC voltage pulse, having an AC voltage signal superimposed thereon, across an insulator or body of dielectric material which is joined to a charge injection source for measuring, with a circuit coupled to the charge injection source over a selected time interval, the net charge injected from the source into the dielectric and simultaneously measuring with a different circuit the corresponding voltage required to restore the surface potential of the semiconductor to the state it was in prior to the application of the DC voltage pulse. These measurements are then used by feeding them into additional circuits which determine the change in the total charge in the semiconductor proper and in the surface states induced by the charge trapped in the insulator.

DESCRIPTION OF THE DRAWINGS

These and other features, advantages, and objects of the present invention will be more fully appreciated from the following detailed description of a preferred embodiment of the invention taken in conjunction with the accompanying drawings in which.

DESCRIPTION OF THE PREFERRED EMBODIMENT

Referring now to the drawings an apparatus employing the present invention will be described in detail as to its construction and operation.

To fully appreciate the invention a brief discussion of charge injection in trapping insulators may be appropriate before a detailed description of the invention is given. Generally speaking, upon application of sufficient voltage across the dielectric body having electrodes attached thereto a finite conduction current can be caused to flow in the dielectric. This current comprises of a flow of charge carriers, for example electrons, in the conduction band of the dielectric or of electrons tunneling from one trap site to another in the dielectric under the influence of the applied voltages. At the same time carriers may also be injected across the electrode-dielectric interface into the conduction band of the dielectric or into traps in the dielectric where they, being electrons, tend to travel toward the positively biased electrode. Some of these carriers so injected will in their passage through the dielectric become trapped in appropriate trapping states existing in the body. Such traps may be, for example, due to defects, inclusions, or impurities in the dielectric body. In any event, there will be a change in the charge distribution in the insulator.

Due to thermal excitation and the influence of the applied voltage, there will be an exchange of charges between the trap states and states in the conduction band. This charge distribution within the dielectric is, of course, a function of the applied voltage and of the spatial and energetic distribution of traps in the dielectric.

By varying the amplitude of the applied voltage and its duration, a controlled amount of charge is injected into the dielectric. Of course, the amount of charge induced in the semiconductor and in the surface states and, consequently, the amplitude of the semiconductor surface potential are dependent on the amount of injected charge actually trapped in the insulator.

Depending on the polarity of the applied voltage, either electrons or holes can be injected from the semiconductor into the insulator. Generally speaking, holes and electrons have different injection co-efficient, trapping level, rates of decay, etc. Thus the use of injected holes will cause the charge to be trapped at different positions, resulting in a different amount of surface state change in the semiconductor than would occur if electrons are injected. That is to say, for the same MIS structure the same magnitude pulse will produce different results depending on whether holes or electrons are being injected.

When the dielectric body is a dual dielectric combination now used, for example, in the so-called MNOS metal-nitride-oxide-silicon nonvolatile semiconductor device, the same situation described above generally holds true. However, here because of the differences in the electronic properties of the two materials and their relative thicknesses, substantially all the trapping occurs in the silicon nitride.

Considering the case for such an MNOS structure where the injector is a N-type semiconductor and a sufficiently high positive pulse is applied at the gate-electrode, i.e., the metal or metal-like electrode, electrons are injected from the surface of the semiconductor into the nitride via tunnelling through the thin layer of oxide. When the amplitude of the pulse is now sufficiently reduced, some of the electrons previously injected are now trapped in the nitride, tending to attract holes in the semiconductor towards the oxide-semiconductor interface and to alter the occupancy of surface states. This change in charge polarity as well as in density causes, in turn, changes in the semiconductor surface potential the differential capacitance of the MIS structure is flat band voltage.

Figure 1:
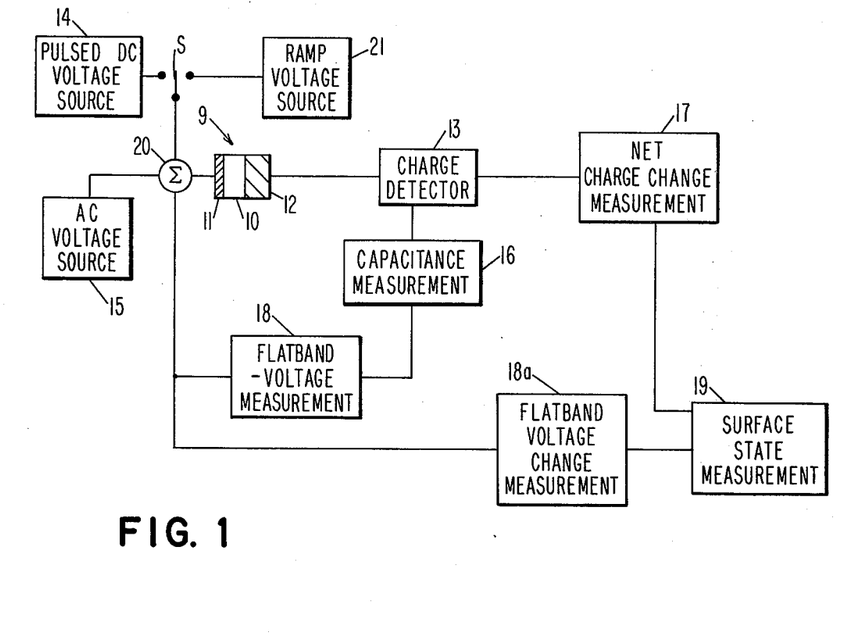
FIG. 1 illustrates in functional block form a complete system employing the present invention.

A dielectric 10 under test, as shown in FIG. 1 has a metal electrode 11 on one surface thereof and a semiconductor body that serves as a charge injection source 12 on the opposite surface thereof. Coupled to this charge injection source 12 is a charge detector circuit 13 capable of measuring the amount of net charge injected into the dielectric 10 when a DC signal in form of a pulse from source 14 having a superimposed AC voltage signal from source 15, and a feedback signal from the detector 13, as modified by a capacitance measurement circuit 16 and a flat band voltage measurement circuit 18 and fed through summing circuit 20 is impressed upon the electrode 11. This impressment of these signals on the electrode 11 causes charge to be injected into the dielectric from the charge injection source 12. Other methods of charge injection such as photo-injection, can, of course, be used either in place of, or in conjunction with, source 14.

The output of the charge detector 13, which is directly proportional to the charge injected into the dielectric 10 from the body 12, is coupled to a pulsed sample and hold circuit 17 which measures the change in net charge in the injector 12 and its surface states by taking the difference between the voltage from the detector 13 at a time prior to the application of the voltage pulse from source 14 and the voltage, also from detector 13, but at a time after the termination of the voltage from source 14. The voltage output of detector 13 is representative of the initial state of injector 12 and representative of the state of injector 12 after the voltage pulse source 14. Another sample and hold circuit 18a measures the corresponding change in the flat band voltage as a result of the application of the voltage pulse source 14 at electrode 11, through the feedback mechanism of the feedback loop, comprising of circuits 13, 16, 18, and 20, the flat band voltage measurement circuit 18 automatically measures the flat band voltage of the MIS structure at selected times prior to and after the application of voltage pulse source 14. This change in flat band voltage is measured, as a result of restoring, by capacitive action and via the feedback mechanism of the feedback loop, the surface potential of the charge injector 12 to its original state, i.e., prior to the voltage pulse from source 14. The outputs of circuits 17 and 18 are fed into circuit 19 whose output is a measurement of the number of surface states at the semiconductor-dielectric surface.

When the thickness of the total dielectric 10 is 1000 Angstroms or less and the charge injector 12 is a semiconductor body, say, silicon, the pulsed DC voltage source 14 should be capable of supplying voltages up to 100 volts over a time period of a few seconds. Of course, other sources having voltages and durations of greater or lesser value will be used when different thicknesses or materials are used. The AC voltage source 15, in the particular embodiment described here, has a 100 KC output ± 20 mv. AC, sources of other appropriate frequencies and amplitudes can, of course, be used.

Injection of charges from the charge injector 12 into the dielectric 10 causes change in charge in the charge-injector and in its surface states very near or at the dielectric-semiconductor interface. The charge-detector 13 measures both the charge in the surface states and in injector 12 and the charge trapped in the dielectric. In order to have separate, distinct and accurate readings of the amount of trapped charge in the dielectric and the corresponding charge induced in the surface states and in the semiconductor body 12, after the pulse, it is necessary that the condition of the surface of the charge injection be re-established to its original condition.

Referring now to FIGS. 2 to 6, the invention will be described in greater detail.

Figure 2:
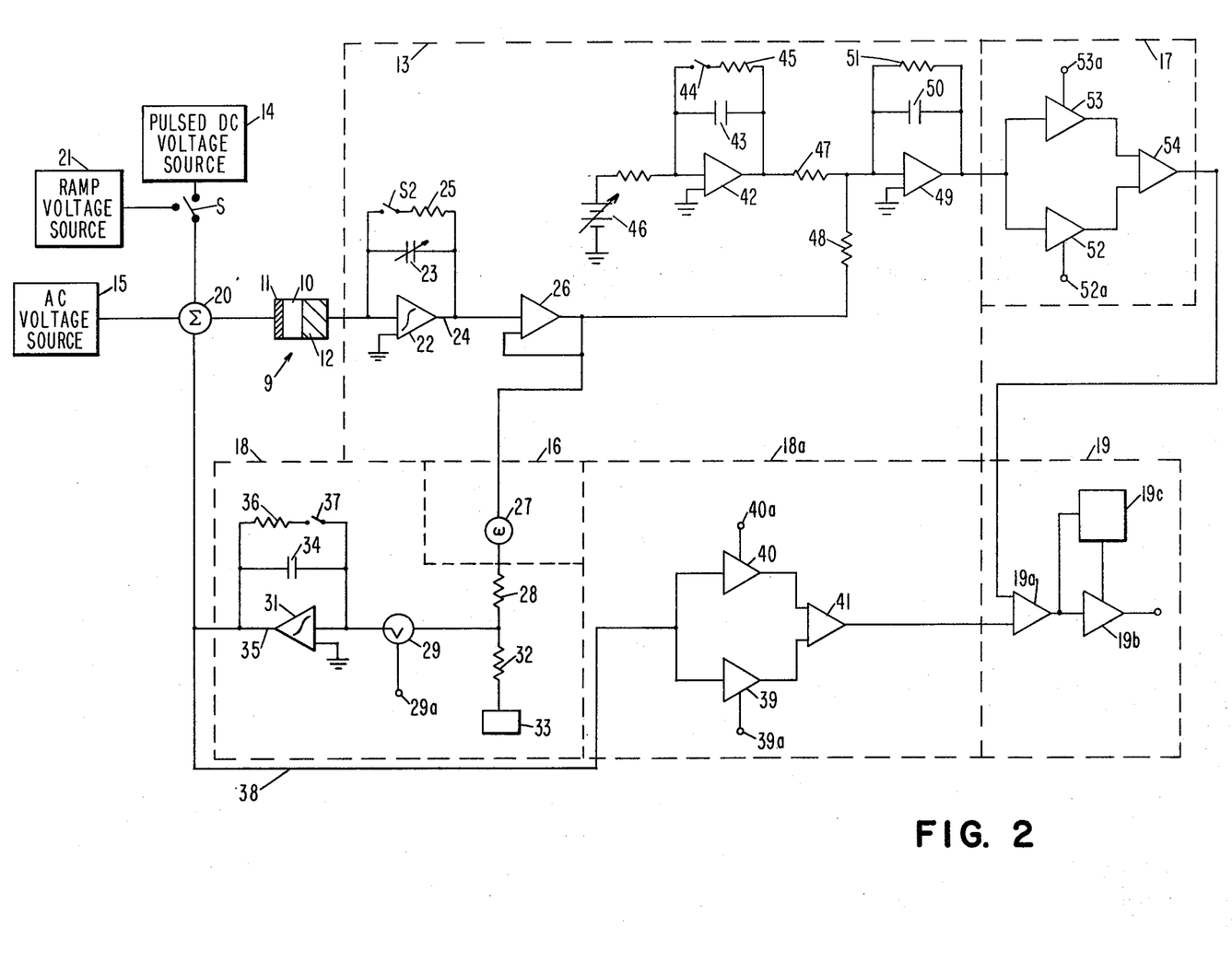
FIG. 2 illustrates in schematic form a complete system of the invention.

The electrode 11, on the dielectric 10, is coupled to a summing circuit 20. Into this summing circuit 20 is fed a signal from the AC source 15, a signal from the flat band voltage measurement circuit 18 and, through a switch S, either a signal from the pulsed DC source 14 or from a ramp voltage source 21. The charge injector 12 is in turn coupled to the negative input of an operational amplifier 22 which has a variable capacitor 23 connected between its negative input and its output 24.

This capacitor 23 causes the amplifier 22 to integrate the current at the negative input, if a parallel resistor 25 is not connected to the input of 22 through switch S2. The output 24 is, in turn, connected through a buffer circuit 26 to a phase-locking amplifier 27 whose output is connected through a resistor 28 and a pulsed switch 29 to the negative input of another operational amplifier 31 and, through another resistor 32, to a voltage reference source 33. The operational amplifier 31 also has a capacitor 34 coupled between its negative input and its output 35. Also coupled across the amplifier 31 in parallel with the capacitor 34 is a resistor 36 and a switch 37 which when in the open position, as indicated in FIG. 2, will cause amplifier 31 to act as an integrator. The output 35 of amplifier 31 is connected into the summing circuit 20 and via lead 38 to the parallel sample-and-hold differential amplifier system 18a comprised of sample-and-hold circuits 39 and 40 the outputs of which are connected to the inputs of a differential amplifier 41.

The output of buffer circuit 26 is also, through resistors 47 and 48, coupled to the output of an integrating amplifier 42, having a capacitor 43 in parallel with a switch 44 in series with a resistor 45 coupled between its negative input and output. Amplifier 42 will act as an integrator, when switch 44 is in the open position as indicated. The negative input of amplifier 42 is also coupled to an adjustable voltage source 46 such that its output, coupled through resistor 47, is, at the negative input of a summing circuit 49, equal and opposite to any undesired leakage due to the measurement system.

The summing amplifier 49 across whose input and output is coupled a capacitor 50 in parallel with a resistor 51 has its output coupled to the inputs of a second parallel sample-and-hold differential amplifier system 17 comprising of sample-and-hold circuits 52 and 53 whose outputs are connected to the inputs of a differential amplifier 54.

The output of the integrator 42 is, at summing circuit 49, equal to and opposite to the leakage inherent in the measurement system caused by drifts in its electronic components. The integrator 42 is thus basically a leakage null circuit set to compensate for leakage in the system, and is set by adjusting voltage source 46 and monitoring the output of amplifier 49, until the output of amplifier 49 stops changing and is stabilized.

The above described circuit operates as follows: a pristine structure, immediately after its construction, is placed in the circuit and its capacitive voltage curve, commonly known as a CV plot, is obtained. To accomplish this switch S is set to couple the ramp voltage source 21 to the summing circuit 20, switch 29 is closed by applying a suitable voltage to node 29a, and switches S2 and 37 closed. Closing of switch S2 prevents the output of amplifier 22 from saturating due to an excessive current due to the ramp voltage. However, the resistor 25, relative to capacitor 23, is chosen such that this RC combination allows amplifier 22 to continue to act as an integrator at the frequency of source 15.

Closing of switch 37 keeps the output 35 of amplifier 31 at zero so that it will not interfere with the obtaining of this CV plot. The output of this ramp voltage source 21 varies from, say, −30v to +30v volts. This ramp voltage is now fed into summing circuit 20 together with the sinusoidal signal, from the AC voltage source 15, where they are summed and applied to the electrode 11. The application of such a combination of voltages to the electrode 11 causes a current to flow into the charge injector 12. This current flow is detected at the negative input of the operational amplifier 22 which is coupled directly to the semiconductor body 12. This operational amplifier 22, by virtue of a negative feedback arrangement through the capacitor 23, serves to integrate the current flow detected at its input 21. The output 24 of the operational amplifier 22 thus provides a signal which is proportional to the integral of the flow caused by carriers being injected into the charge injector 12. This signal is then applied through the buffer amplifier 26 to the phase-locking amplifier 27 whose output is proportional to the RMS value of the response of the device to the 100 kilocycle AC signal applied thereto. Thus the output of this phase-locking amplifier 27 is proportional to the capacitance of the structure corresponding to the voltage the ramp voltage source at the time. The output of this phase-locking amplifier can, if necessary, be fed into a linearizing amplifier (not shown) whose output is set to, say, equal 1 volt for each 100 pf of capacitance. The output at node 30 of the amplifier 27 is a measurement of the capacitance of the structure and is plotted, in FIG. 3, against the applied ramp voltage as curve 60. The capacitor 23 is now reset to exactly equal the maximum capacitance Co of the structure. If necessary, the linearizing amplifier can be re-adjusted to again linearize the output of amplifier 27 so that it is set to equal 1 volt for each 100 pf of capacitance.

Figure 3:
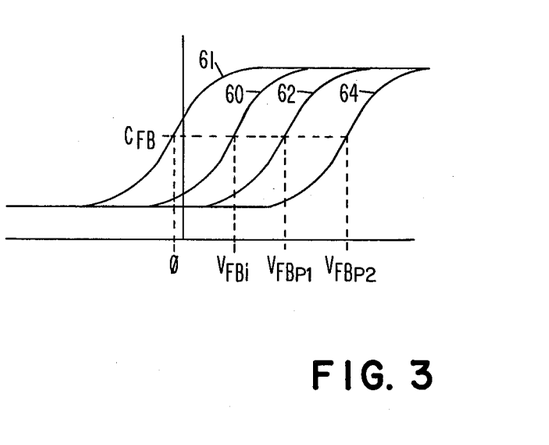
FIG. 3 illustrates the capacitance voltage plot of the device.

As is well known in the semiconductor art the flat band capacitance generally is thus measured: i.e., a ramp voltage is applied to the device to get a high frequency C-V plot as shown in FIG. 3 as curve 60. From this high frequency C-V polt the point of maximum slope is located. This point is, by definition, the flat band capacitance shown in FIG. 3 as CFB and the voltage at which it occurs is the flat band voltage. Alternatively, one may choose to calculate the flat band capacitance CFB in a procedure described, for example, by S. M. Sze in "Physics of Semiconductor Devices", published by John Wiley and Sons Co. on page 432. In an ideal structure, in which no charge has been trapped in the insulator during the creation of the insulator or by previous electrical treatments and no surface states, the work function difference $\phi$ between the electrode and the charge injector is equal to the flat band voltage. The work function, difference between the electrode and the charge injector is, of course, readily calculable since the work function of the respective materials are well known physical constants. However, since insulators may not be free of charges either due to the manufacturing techniques or because of previous testing during the manufacture, the initial flat band voltage VFBi, originally measured, from curve 60 may not be equal to this work function difference. In FIG. 3 curve 60 illustrates such a case; i.e., where the initial flat band voltage VFBi is not equal to the work function difference $\phi$. For optimum use of this invention, it is desirable that the initial flat band voltage VFBi of the structure be set to be equal to the work function difference $\phi$ of the two materials. These are set equal by removing any initial charge of consequence contained in the insulator by applying to the device an appropriate DC pulse to shift the CV plot along the voltage gradient until VFBi equals, approximately, the expected work function difference $\phi$ between the electrode and the charge injector. For example, let us assume that for a particular device the flat band capacitance CFB is 400 picofarads and the initially measured flat band voltage was say +2 volts. Again let us assume with a work function difference between the electrode and the charge injector is equal to −0.2 volts. To set these values equal to it may be necessary that negative DC pulses be applied across the structure to cause the measured CV curve 60, and thus the measured flat band voltage, to shift to the left and coincide with curve 61. Thus at this time the output of amplifier 27 is equal to 4 volts, since CFB is 400 picofarads, if the ramp voltage is −0.2 volts. An equal voltage, i.e., 4v, of opposite polarity is, by an adjustable battery 33 and resistor 32, now applied to the input of the amplifier 31 through pulsed switch 29 which is set to connect resistors 28 and 32 to the negative input of amplifier 31. Switch 37 is now opened, after source 21 is set to equal zero. At this point, output 35 will read −0.2 volts.

It is precisely because of the fact that the change in flat band voltage arised from charge trapping in the insulator is not zero when a voltage pulse is applied to electrode 11 that the traditional capacitance-voltage or conductance measurement methods, known to the prior art and developed for an MIS structure in which charge trapping in its insulator can be considered inconsequential, are not applicable for measuring the surface state density at or near the semiconductor surface.

It is this distinction between the charge trapped in the insulator and the surface-state charge that the present invention was built to detect and determine.

In the special case of negligible charge trapping in the insulator, the present invention also offers superior advantages over the prior art for measuring surface states. This special case is to be described later.

At this time the structure is now in a condition to have charge injected therein. This is accomplished in the following manner: Switch S is made to connect voltage pulse source 14 to summing circuit 20. Switch S2, across amplifier 22, and switch 37, across amplifier 31, and switch 44, across amplifier 42, are now all opened. At time T0 a pulse 70, shown in FIG. 4, of sufficient voltage is applied to node 29a to cause switch 29 to open. At time T1, source 14 supplies a voltage pulse 71 to the electrode 11. This pulse is, for example, +18 volts. and has a time period of, say, about 2 milliseconds. This pulse 71 is applied to the summing circuit 20 together with the AC signal from the source 15. These two signals are summed and applied to the electrode 11 causing charge injection into the dielectric 10. This causes the C-V curve of the device to shift and is shown in FIG. 3 as curve 62. This charge injection established a new flat band voltage VFBP1 and a new charge state in the charge injector 12 and in the surface states. This in turn gives rise to current at the input 21 of the operational amplifier 22. Negative feedback through the capacitor 23 now begins, causing the input 21 of the operational amplifier 22 to be driven towards virtual ground. The operational amplifier 22 thus integrates its input current. Because capacitor 23 was set to equal the maximum of accumulation capacitance Co obtained from the C-V plot of the device, the subsequent calculations and electronics circuitry is simplified.

The output of amplifier 22 is now fed through the phase-locking amplifier 27. The output of the amplifier 27 is now changed because the C-V curve of the device has been shifted. Because switch 29 is opened, the output of amplifier 31 remains −0.2 volts. The output voltage of the operational amplifier 22 rises sharply and this in turn causes, via the output of buffer 26 and the input resistor 48 the output of summing amplifier 49 to rise sharply as shown by portion 80a of curve 80 of FIG. 5a.

Figure 4A:
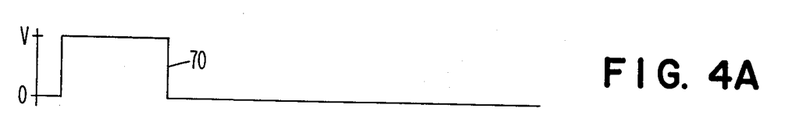
FIGS. 4a, 4b, 4c, and 4d shows the various pulses applied to the system of the invention.
Figure 4B:
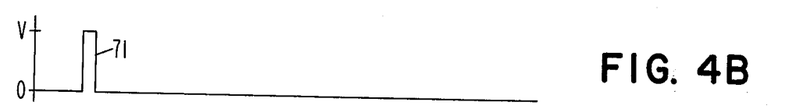
Figure 4C:
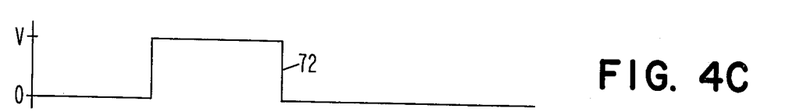
Figure 5A:
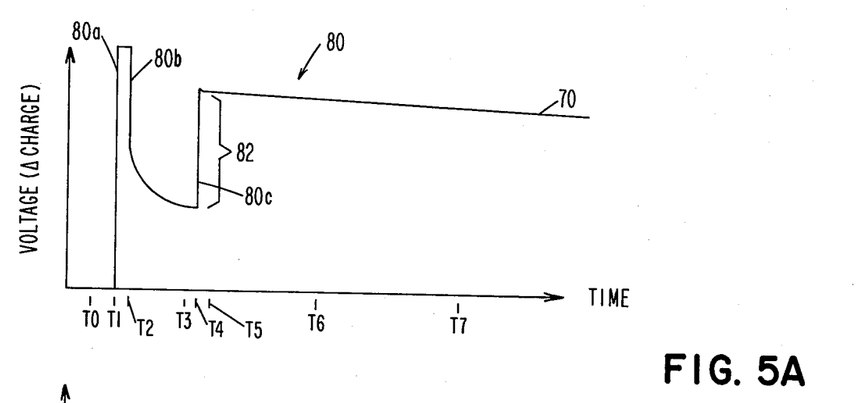
FIG. 5a depicts the output of the charge detector circuit of the invention.

At time T2 the pulse 71 is shut off and the output of amplifier 49 decays to follow the state of the trapped charge and is shown by portion 80b, of curve 80. Because of the trapped charge, the output of amplifier 49 does not return to zero. At time T3 a voltage pulse shown as pulse 72 in FIG. 4c is applied to nodes 40a and 53a of sample and hold circuits 40 and 53. This voltage pulses causes each of the sample-and-hold circuits to 'sample' its input at that particular time and 'hold' the value sampled for subsequent processing at a later time. Thus the outputs of sample-and-hold circuits 40 and 53, connected to differential amplifiers 41 and 54 respectively, remain constant as long as pulse 72 is applied to nodes 40a and 53a.

Thus, output of sample-and-hold circuit 53, within the duration of pulse 72, corresponds to the sum comprising of the level of charge trapped in the dielectric 10, the charge induced by this trapped charge in the semiconductor 12 and charge likewise induced in the surface states, as measured by the summing amplifier 49, since the leakage inherent in the measurement system has been compensated for by the null circuit 42.

Figure 5B:
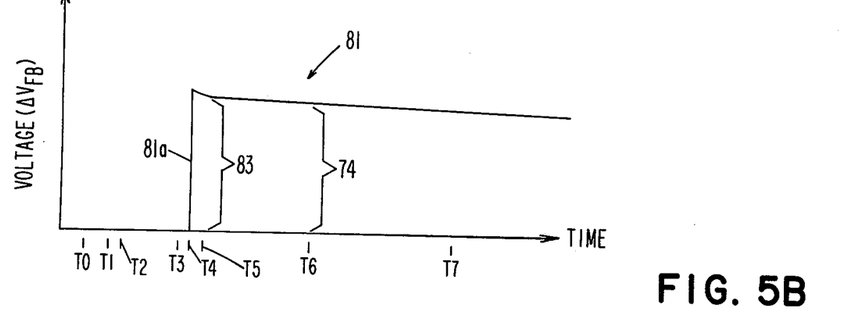
FIG. 5b depicts the output of the flat band voltage measurement circuit.

Similarly, the output of sample-and-hold circuit 40 remains −0.2 volts, as shown in FIG. 5b.

Figure 4D:
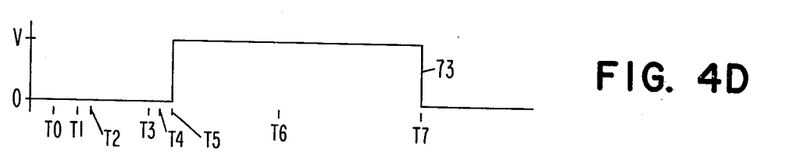

At time T4 pulse 70 is terminated closing switch 29 and the amplifier 31 now begins to integrate the signals, i.e., the new capacitance signal from amplifier 27 and the reference signal 33, applied to its input and produces the signal shown in FIG. 5b as curve 81 which is the change in the flat band voltage from $\phi$ to VFBP1. This charge in flat band voltage is also illustrated in FIG. 3, if one is to measure the CV plot at this time. This voltage VFBP1 is a consequence of forcing, via the feedback loop, the surface of the charge injector 12 back to its original condition. The restoration of the surface potential of the charge injector 12 to its original state is seen in FIG. 5a as rise 80c in curve 80, as charge is being removed from injector 12 and from its surface states. The rise 81a in curve 81 at time T4 in FIG. 5b corresponds to the impressment of the new flat band voltage on electrode 11. Immediately after time T4, that is at time T5, a voltage pulse 73 shown in FIG. 4d is applied to nodes 39a and 52a of sample-and-hold circuits 39 and 52.

Because pulse 72 is still being applied to sample-and-hold curcuitd 53 and 40 their outputs remain equal to the sampled signal they previously detected when pulse 72 came up and they can not detect or sample any further signals until after pulse 72 terminates.

Pulse 73 causes sample-and-hold circuits 39 and 52 to detect the state of signals 81 and 80, respectively, at time T5 and supply suitable output signals to the other terminal of differential amplifiers 41 and 54, respectively. Outputs of sample-and-hold circuits 39 and 52 remain constant during the duration of pulse 73. Since amplifier 54 is now receiving a signal from sample-and-hold circuit 53 indicative of the state of charge in the device at time T3 and a signal from sample-and-hold circuit 52 indicative of the state of charge in the device at time T5, differential amplifier 54 detects this difference and supplies an output signal equal to this difference, shown by bracket 82 in FIG. 5a. This measured difference is proportional to the sum of the charge in the semiconductor body charge-injector 12 and in its surface states induced by the charges injected into and subsequently trapped in the dielectric 10.

Differential amplifier 41 is simultaneously measuring the difference in outputs from sample and hold circuits 39 and 40 and supplying an output signal equal to the corresponding change in flat band voltage indicated by bracket 83 in FIG. 5b.

The outputs of differential amplifiers 54 and 41 can now be in turn fed to still another differential amplifier 19a whose output is the change in the surface potential of the semiconductor body 12 corresponding to its change in charge.

The basis of this can be summarized by the following equations (1) and (2).

$$\int_0^{\phi_s} N_{ss}(\phi'_s)d\phi'_s = \frac{YC_o}{qA} - \frac{Q_s(\phi_s)}{q} \quad (1)$$

and $$\phi_s = Y - \Delta V_{FB} \quad (2)$$

$N_{ss}(\phi'_s)$ = Surface state density at silicon surface potential $\phi'_s$, volt −1 cm −2.

$\phi_s$ = Silicon surface potential induced by injected charges, volt.

$Q_s$ = Net charge density in the semiconductor, coul/cm2.

$C_o$ = Geometric capacitance of insulator, farad.

$\Delta V_{FB}$ = Change in flat band voltage measured at the output of amplifier 41, i.e., bracket 83 in FIG. 5b, having the unit of volt.

$A$ = Area of gate electrode, cm2.

$q = 1.6 \times 10^{-19}$ coulomb $Y$ = proportional to sum of surface state charge and charge in the semiconductor body as measured at the output of amplifier 54, i.e., bracket 82 in FIG. 5a , having the unit of volt.

Thus the output of amplifier 19a is $\phi_s$ and once this value has been established the actual charge in the semiconductor body 12, i.e., $Q_s(\phi_s)$ in equation (1), can be determined by feeding the output of amplifier 19a to a non-linear exponential amplifier 19b whose gain is controlled by a voltage from source 19c equal to the well-known FermiDirac integral corresponding to the voltage output from amplifier 19a. This can also be calculated by knowning the impurity concentration of semiconductor 12. Knowing $Q_s(\phi_s)$ and Y which is output of amplifier 54, the important quantity $$\int_0^{\phi_s} N_{ss}(\phi'_s)d\phi'_s$$

can now be readily determined in accordance with equation (1).

The intergrant $N_{ss}(\phi'_s)$ is the density of surface states per unit energy per square centimeter of surface area and the value of the integral, as shown in equation (1) is the net change in the number of surface state charge per square centimeter of surface area, existing in the body 12, when the surface potential is swept from zero, i.e., flat band condition, to the surface potential $\phi_s$.

Thus, in summary, the measurement technique, here described, comprises of the measurement of the semiconductor surface potential $\phi_s$ and the corresponding surface state charge, in the presence of charge trapping in the insulator. In fact that charge trapping itself is used in the present invention to advantage, rather than existing as a hinderance as in the prior art, to induce or uncover the surface state charges so that it can be measured. Repeating the above procedure at time after, say T7, with the application of a different voltage pulse of different width and/or amplitude will give rise to different amount of charge trapped in the insulator hence resulting in different values for the semiconductor surface potential ($\phi_s$), as suggested by curve 64 in FIG. 3.

Figure 6:
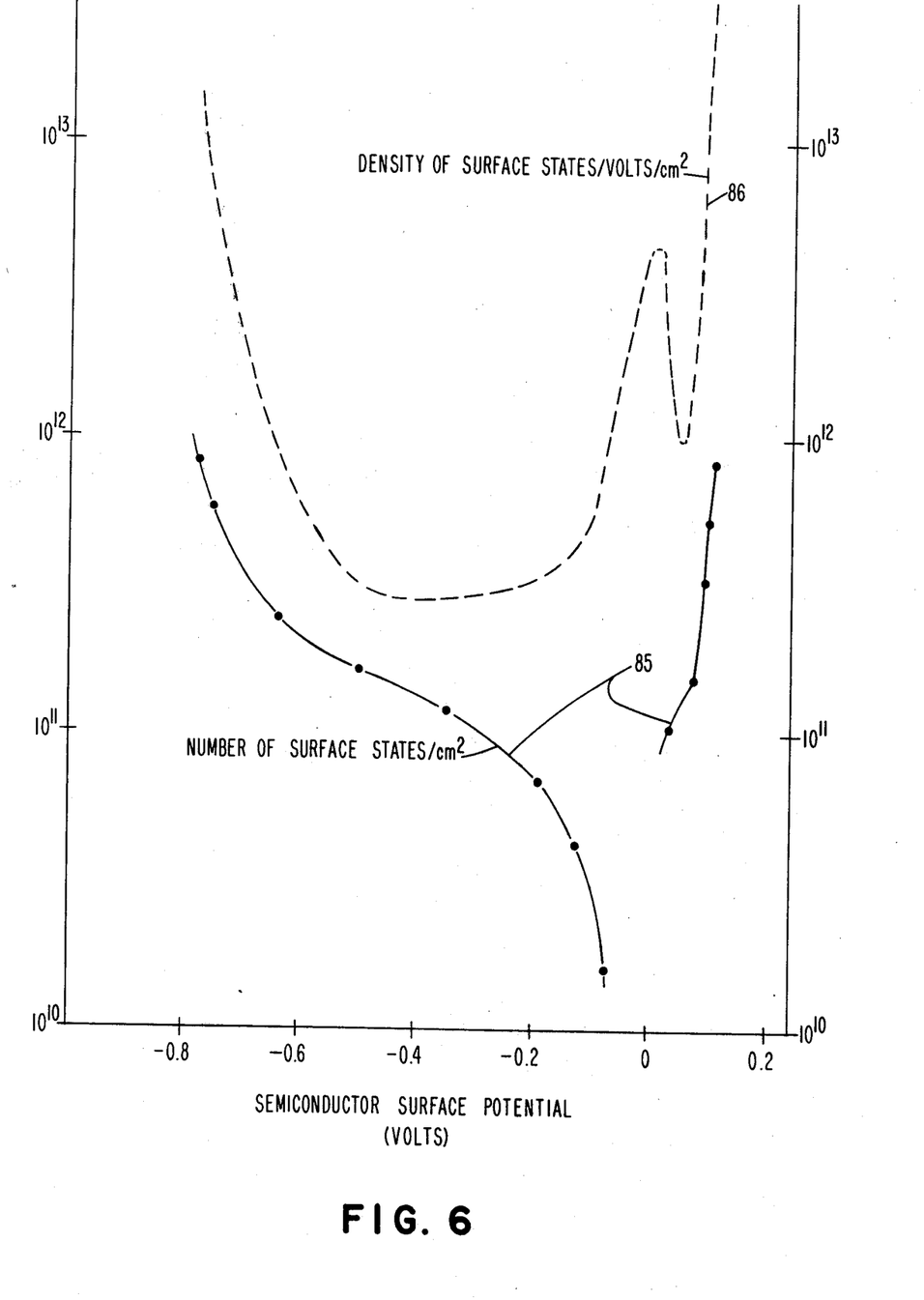
FIG. 6 is a plot of the measurement of the fast surface states as function of the semiconductor surface potential.

Curve 85, in FIG. 6, depicts an experimental plot of the integral $$\int_0^{\phi_s} N_{ss}(\phi'_s) d\phi'_s$$

versus the semiconductor surface potential, $\phi_s$.

Differentiation of this integral with respect to the semiconductor surface potential yields the density of surface states and is shown by curve 86.

At this point, the advantages of the present invention, over the prior art for measuring surface potential $\phi_s$ and, consequently, the surface state density $N_{ss}(\phi_s)$, can be further appreciated by briefly examining the very essence of the idea involved, as follows:

Let the voltage at the gate-electrode 11 be denoted by Vg(t). Then, it can be shown that at any time t, $$Vg(t) = VFB(t) + \phi_s(t) = \frac{Qs(t)}{Co} - \frac{Qss(t)}{Co}, \quad (3)$$

where Qss(t) is the surface state charge /cm² relative to the surface state charge at flat band condition specified by $\phi_s = 0$. Other symbols have meanings previously defined above. Incidently, VFB(t) is therefore the voltage which when applied to electrode 11 will cause $$Qs(t) = qss(t) = \phi_s(t) = 0,$$

i.e., flat band condition. It is well known that VFB(t), among other things is dependent of the charge distribution in the insulator. Therefore, if this charge distribution, denoting it by P(x,t) for convenience, should change during a time interval, say Tm, needed for a complete measurement sequence so that the surface states can be determined, so will VFB(t). Also if the MIS structure is disturbed in any way, for example, by the application of the voltage Vg(t) or by other means such as photo-excitation, the externally measurable current will respond to the disturbance according to:

$$\int_\delta^t J(t')dt' = \int_\delta^t Jc(xt')dt' - \Delta Qs(t) - \Delta Qss(t) - \Delta Q(x,t), \quad (4)$$

where
$$J(t) = I(t)/A,$$
and Q (x,t) is the net charge/cm² bounded by the interface between injector 12 and the dielectric and the plane located at a distance x away from the interface between electrode 11 and the dielectric. Jc(x,t) is the conduction current density flowing across this plane at x. The symbol Δ merely denotes the charge in the respective quantity over the time interval ($\delta,t$). For example $$\Delta Q(x,t) = Q(x,t) - Q(x,\delta).$$

Combining equations 3 and 4 yields.

$$\Delta \phi_s(t) = \Delta Vg(t) - \int_\delta^t J(t')dt'/C_o - \Delta VFB(t) - \Delta Q(x,t) + \int_\delta^t J_c(x,t')dt'/C_o. \quad (5)$$

The above equation 5 helps to summarize the essentials of the present invention. It is clear that the measurement time interval Tm necessary for a complete measurement sequence is equal to $(t-\delta)$, i.e., $tm = (t-\delta)$. If the insulator charge distribution P(x, t) changes, i.e., $\delta P(x,t)/\delta t \neq 0$, during Tm, then the last three terms in equation 5 are finite and may not be neglected in evaluating $\Delta \phi_s$. Yet, the prior art does just that, i.e., it assumes that $\Delta P(x,t)/\delta t = 0$, so that the last three terms in equation 5 are considered zero in evaluating $\Delta \phi_s$. Very often, and especially in the case of the thin-oxide MNOS memory devices, such an assumption is not valid. This point can be appreciated, when one realizes the measurement time Tm in the conventional so-called low-frequency quasi-state CV techniques for measuring the surface potential $\phi_s$ is generally in the range of minutes and, at times, approaching tens of minutes. A discussion of this low-frequency technique can be found in the text by S. M. Sze referenced above or in a paper by C. N. Berglund appearing in IEEE Transaction on Electron Devices, Vol. ED-13, No. 10, October 1960, page 701, or a paper by R. Castagne appearing in Comptes Rendus, Vol. B267, 866 (1968).

In the present invention, the problem of changing P(x,t) is over come by three features inherent in the invention.

The first of these is the direct observation of $\delta P(x,t)/\delta t$, which is proportional to the slope of the decay curve 80b in figure 5A. Note that the amplitude of the slope, i.e., ($\delta P(x,t)/\delta t$), is monotonically decreasing with time. Therefore, this invention teaches that one should observe this curve and wait until ($\delta P(x,t)/\delta t$) is sufficiently small, i.e., as small as one pleases, before making measurements of surface potential and surface state charge. That is to say, make (T3-T2) sufficiently large.

The second of these features is the smallness of Tm necessary. It is crucial to realize that in the present invention Tm is not T3, or (T3-T2). In the present invention, T m=((T5-T3) which in the present working system is in the order of a few milliseconds and can be made smaller, if desired, in striking contrast to the many minutes or tens of minutes required in the prior arts as mentioned before. Thus, the error caused by the change P(x, t) during the measurement sequence is correspondingly less in the present invention.

The third of these features is that the upper limit of any error caused by the changing P(x,t) is readily calculable in the present invention, a feature which does not exist in the prior arts. In the present invention the upper limit of any error, designated by Em, caused by changing P(x,t) is, $$Em = \left(\frac{\delta P(x,t)}{\delta t}\right)_{T3} (T5 - T3) \qquad (6)$$

where $(\delta P(x,t)/\delta t)_{T3}$ denotes the value of the slope of curve $80b$ at time T3. The basis for the validity of equation 6 is that the application of the voltage $81a$ in FIG. $5b$ causes the following to be true:

$$\left(\frac{\delta P(x,t)}{\delta t}\right)_{t>T3} < \left(\frac{\delta P(x,t)}{\delta t}\right)_{T3} \qquad (7)$$

Thus, the present invention teaches a method for measuring the surface potential $\phi_s$ and, hence, the surface states of a semiconductor in an MIS structure, which overcomes the problems caused by the changing $P(x,t)$ suffered by the prior arts. This invention teaches the methods, principles, criteria, and the construction of measurement system for reducing Em as small as one pleases by making (T3-T2) sufficiently large and simultaneously (T5-T3) sufficiently small, so that measurements of surface states in MIS can be obtained accurately and free of ambiguities.

In the special event of negligible charge trapping or charge redistribution in the insulator, $$\delta P(x, t)/\delta t = 0.$$

Then equations 5 and 4 are simplified to $$\Delta \phi_s(t) = \Delta Vg(t) - \int_\delta^t J(t')dt'/C_o \qquad (5a)$$

$$\Delta Q_s(t) + \Delta Q_{ss}(t) = - \int_\delta^t J(t')dt' \qquad (4a)$$

Then in the special case in which $P(x,t) = $ constant in time, the overwhelming advantage of the present invention over the prior arts for measuring semiconductor surface potential and surface states becomes immediately apparent by choosing the time reference $\delta$ to be the time when $Vg(\delta) = VFB$. Now VFB is constant for a given MIS structure, because of the consistency of $P(x,t)$. But at flat band condition, $\phi_s = Q_s = 0$. Therefore, equation 5a and 4a becomes, $$\phi_s(t) = Vg(t) - VFB - \int_\delta^t J(t')dt'/C_o \qquad (5a-1)$$

$$Q_s(t) + Q_{ss}(t) = - \int_\delta^t J(t')dt'/C_o \qquad (4a-1)$$

Now, it is seen that this invention teaches the direct measurement of $\phi_s$. Of course, once $\phi_s$ is known, $Q_s(\phi_s)$ can be readily calculated from the Fermi-Dirac distribution for a given impurity concentration in the semiconductor. Therefore, $Q_{ss}(\phi_s)$ is also directly and simply measured, via equation 4a-1 and recalling that $\int_\delta^t J(t')dt'/C_o$ is directly from the output of amplifier 54. Of course, one may further facilitate the measurement by storing in advance the value of the function $Q_s(\phi_s)$ in a complete memory and recalling its value when needed, so that $Q_{ss}(\phi_s)$ can be automatically displayed. Of course, circuits 18 and $18a$ are no longer necessary, since $Vg(t)$ can be now be directly measured at electrode 11. Pulse 71 now starts at time T4 and extends slightly beyond T5. One may also use the ramp voltage 21 instead of pulse 14, so that a continuous $[Q_s(\phi_s) + Q_{ss}(\phi_s)]$ VS. $\phi_s$ is contained.

The prior art of measuring $\phi_s$, which holds only if $P(x,t)$ is constant in time, requires the measuring of a complete low-frequency C-V plot, spanning strong accumulation and strong inversion under thermal equilibrium condition and, once this complete C-V plot is obtained, the integration of this plot from which $\phi_s$ is then obtained. The measurement of such a thermal equilibrium low-frequency plot requires many minutes or, at times, tens of minutes. Furthermore, extensive calculation and care in the interpretation is required for an accurate measurement of $\phi_s$. The ease, simplicity, speed and accuracy with which the present invention measures $\phi_s$ can best be appreciated by comparing it with the descriptions of the low-frequency CV technique for measuring $\phi_s$ in the reference mentioned above.

While the invention has been particularly shown and described with reference to the preferred embodiment thereof it will be understood by those skilled in the art that various changes in form and details of the apparatus and method may be made therein without departing from the spirit and scope of the invention and that the method is in no way restricted by the apparatus.

What is claimed is:

1. An apparatus for measuring the number of surface state charges in a metal-insulator-semiconductor-structure comprising, means for injecting a controlled amount of charges from said semiconductor into the insulator to induce a change in surface state occupancy in said semiconductor, means coupled to said semiconductor for monitoring the rate of change of said injected charges in said insulator until said rate of change reaches a predetermined level, means coupled to said monitoring means for measuring the change of surface potential of said semiconductor and for simultaneously inhibiting the rate of change of charge in the insulator and, means coupled to the measuring means for converting the measured amount of change in said surface potential into a measurement of the quantity of said surface state charges within a specific energy band.

2. An apparatus for measuring the number of surface state charges in a metal-insulator-semiconductor-structure comprising:

a metal-insulator-semiconductor-structure, voltage means for applying a distinct voltage across the structure to cause charges to be injected from the semiconductor into the insulator to induce a change in surface state occupancy in the semiconductor, charge detector means coupled to the semiconductor for measuring the amount of charges injected into the insulator, capacitance measurement means coupled to said charge detector means for measuring the change in capacitance in the structure caused by the injection of said charges into said insulator, means for measuring the net change in charge in said insulator, means for measuring the initial flat band voltage of said structure and the change in flat band voltage of said structure induced by said charges being injected into said insulator, and means coupled to said means for measuring the net change in charge in said semiconductor and to said means for measuring the change in flat band voltage for measuring the number of surface states in said semiconductor.

3. The apparatus of claim 2 wherein said means for measuring the number of surface states in said structure comprises means for measuring the surface potential change of said semiconductor and means for measuring the number of surface state charges in said semiconductor.

4. The apparatus of claim 3 wherein said means for measuring the number of surface state charges comprises a nonlinear expotential amplifier whose gain is a voltage equal to the Fermi-Dirac integral corresponding to the measured surface potential change of said semiconductor.

5. The apparatus of claim 2 wherein said net charge change measurement means comprises a pair of parallel sample-and-hold circuits whose outputs are coupled to a differential amplifier.

6. The apparatus of claim 2 wherein said flat band voltage change measurement circuit comprises a pair of parallel sample-and-hold circuits whose outputs are coupled to a differential amplifier.

7. The apparatus of claim 2 wherein said flat band voltage measurement comprises a pulse switch coupled to said capacitance measurement means and feeding an integrating amplifier whose output is coupled to said voltage means for applying a voltage across said structure and to said flat band voltage change measurement circuit.

8. The apparatus of claim 2 wherein said capacitance measurement means comprises a phaselocking amplifier.

9. The apparatus of claim 2 wherein said charge-detecting means comprises an integrating operational amplifier having its input ohmically connected to the semiconductor body and its output coupled to a buffer amplifier whose output is coupled to said capacitance measuring means and to said net charge change measurement means.

10. The apparatus of claim 9 wherein said buffer amplifier has its output also coupled to an adjustable voltage source such that its output is equal and opposite to the leakage through said first integrating amplifier.

11. The apparatus of claim 2 wherein said applying means comprises a feedback loop between said measuring means and said voltage means.

12. An apparatus for measuring and quantitatively determining the number of surface states at or near the semiconductor surface of a semiconductor body having an insulator disposed on its surface comprising, a first voltage source providing a periodic voltage, a second voltage source providing a nonperiodic voltage, a first summing circuit coupled to both of said voltage sources and to an electrode on said insulator for superimposing said voltages on one another and impressing these voltages across said insulator to cause charges to be injected from said body into said insulator which injector charge induces a change in the surface potential of said body, a charge measuring circuit coupled to said body for measuring over a selected time interval the net charge injected into said insulator, and for simultaneously measuring the change in the nonperiodic voltage required to restore the surface potential of the body to its original state which existed prior to said charge injection, a capacitance measurement circuit connected to said charge measuring circuit, a flat band voltage measurement circuit connected to said capacitance measuring circuit and said first summing circuit, a flat band voltage change measurement circuit for determining the change of flat band voltage as a result of the application of a voltage pulse across the insulator causing charge injection into the insulator connected to said flat band voltage measuring circuit and said first summing circuit, a net charge change measurement circuit for determining the change in the state of the net charge in the semiconductor body connected to the charge measuring circuit, and a surface state measurement circuit for displaying the density of surface states in the semiconductor body connected to said net charge change measuring circuit and said flat band measurement circuit, said charge measuring circuit comprising a first integrating amplifier having its input coupled to the semiconductor body and its output coupled through a buffer amplifier to a second summing circuit and a second integrating amplifier and to said capacitance measurement circuit, said capacitance measurement circuit comprising a phase-locking amplifier coupled to said flat band voltage measurement circuit, said flat band voltage measurement circuit comprising a reference voltage source and a pulsed switch, said pulsed switch being coupled to the input of a third integrating amplifier whose output is coupled to said first summing circuit and to said flat band voltage change measurement circuit, said net charge change measurement circuit coupled between said charge measurement and said surface state measurement circuit comprising a pair of parallel sample-and-hold circuits each of which is coupled to a respective input of a differential amplifier whose output is coupled to said surface state measurement circuit, said flat band voltage change measurement circuit coupled between said flat band voltage measuring circuit and said surface state measurement circuit comprising a pair of parallel sample-and-hold circuits whose outputs are respectively coupled to the inputs of a differential amplifier having its output connected to said surface state measurement circuit, said surface state measurement circuit comprising a differential amplifier having a first input coupled to the output of said net charge change measurement circuit and a second input coupled to said flat band voltage change measurement circuit and an output coupled to a nonlinear expontential amplifier whose gain is a voltage from a suitable source equal to the well-known Fermi-Dirac integral corresponding to the voltage output from amplifier 19a to provide at the output of said nonlinear expotential amplifier a measurement of the density of surface states in the semiconductor body.

* * * * *